9/26/78 XR 4,117,074

United States Patent [19]

Tiersten et al.

[11] 4,117,074

[45] Sep. 26, 1978

[54] MONOLITHIC MOSAIC PIEZOELECTRIC TRANSDUCER UTILIZING TRAPPED ENERGY MODES

[76] Inventors: Harry F. Tiersten, 2288 Pine Haven Dr., Schenectady, N.Y. 12309; John F. McDonald, 608 Crescent Village Apts., Clifton Pk., N.Y. 12065; Pankaj K. Das, 15 Johnson Rd., Cohoes, N.Y. 12047

[21] Appl. No.: 718,603

[22] Filed: Aug. 30, 1976

[51] Int. Cl.[2] .............................................. H01L 41/10

[52] U.S. Cl. ...................................... 310/320; 310/334

[58] Field of Search ................... 310/8.1, 8.2, 8.3, 8.7, 310/9.7, 9.8, 9.5, 9.6, 320, 322, 334; 340/9, 8 R, 10

[56] References Cited

U.S. PATENT DOCUMENTS

| | | | |
|---|---|---|---|
| 3,384,768 | 5/1968 | Shockley et al. | 310/8.2 X |
| 3,401,276 | 9/1968 | Curran et al. | 310/8.2 X |
| 3,891,872 | 6/1975 | Nagata et al. | 310/9.6 X |
| 3,904,274 | 9/1975 | Feinleib et al. | 310/9.8 X |
| 3,961,210 | 6/1976 | Nagata et al. | 310/9.6 X |
| 3,971,962 | 7/1976 | Green | 310/8.7 X |

*Primary Examiner*—Mark O. Budd
*Attorney, Agent, or Firm*—Darby & Darby

[57] ABSTRACT

A transducer array comprising a large number of separated sets of electrodes plated on a single piezoelectric plate of uniform thickness is described. Each set of electrodes is made to act essentially independently by placing them sufficiently far apart and employing an essentially trapped energy mode.

15 Claims, 8 Drawing Figures

FIG. 4
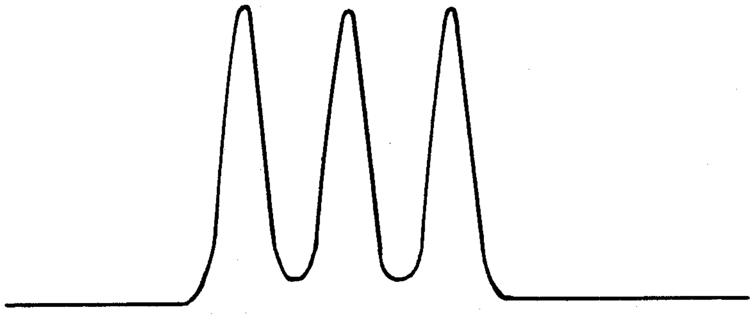
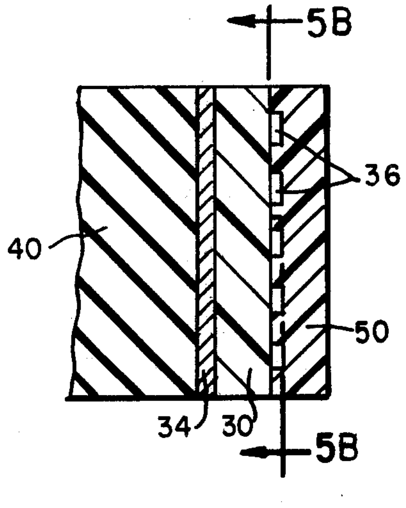
FIG. 5A
FIG. 5B
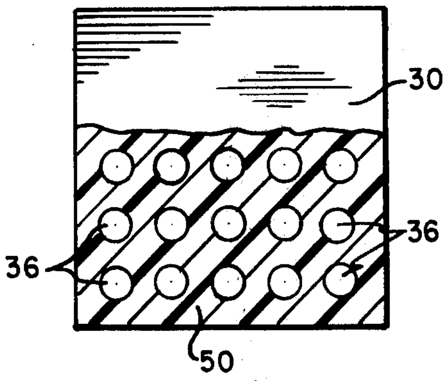
FIG. 6
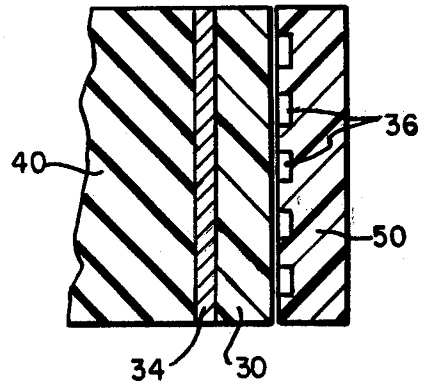

MONOLITHIC MOSAIC PIEZOELECTRIC TRANSDUCER UTILIZING TRAPPED ENERGY MODES

Arrays of transducers, for converting electrical to mechanical energy and vice versa, have a variety of uses. For example, such arrays are used in medical applications for imaging by ultrasonic energy, in industrial applications, etc. One element often used in transducer arrays of this type is a piezoelectric element which vibrates in a variety of directions upon application of electrical energy to plates which are affixed, for example by plating, to the piezoelectric body.

Attempts have been made to use a large number of piezoelectric transducer elements in an array, or mosaic. A major difficulty in the fabrication of a large mosaic transducer is in achieving adequate acoustic isolation of the small transducer elements making up the array. In order to obtain the isolation, one approach has been to combine completely separate individual transducer elements while another has been to use a large piezoelectric plate with grooves. These approaches are described in F. L. Thurstone and O. T. Von Ramur, "A New Ultrasound Imaging Technique Employing Two-Dimensional Electronic Beam Steering," Acoustical Holography, Plenum Press, New York, Vol. 5, pp. 249–259 (1974); and M. G. Magninness, J. D. Plummer and J. D. Meindl, "An Acoustic Image Sensor Using a Transmit-Receive Array," Acoustical Holography, Plenum Press, New York, Vol. 5, pp. 619–631 (1974). In general, both approaches have problems which do not make them entirely suitable. While the second approach of using the grooved plate is somewhat less cumbersome, it still gives rise to difficulties for very small element sizes.

The present invention relates to a transducer array of the piezoelectric type which is designed to avoid the difficulties inherent in the foregoing approaches. In accordance with the invention a new transducer array structure is provided in which acoustic isolation is obtained in a novel manner without cumbersome mechanical structures and in which only the metalization of a large piezoelectric plate of uniform thickness is required. The desired isolation of the individual elements is achieved by employing an effect known as acoustic energy trapping, which results from the natural ever present mass loading and electrical shorting of the electrodes on a piezoelectric body. The acoustic energy traping effect is described in various publications, such as W. Schockley, D. R. Curran and D. J. Koneval, "Energy Trapping and Related Studies of Multiple Electrode Filter Crystals," Proc. 17th Annual Symposium on Frequency Control, 88 (1963); W. Schockley, D. R. Curran and D. J. Koneval, "Trapped Energy Modes in Quartz Crystal Filters," J. Acoust. Soc. Am., 41, 981 (1967); M. Onoe and H. Jumonji, "Analysis of Piezoelectric Resonators Vibrating in Trapped Energy Modes," Electronics and Comm. Eng. (Japan), 84 (1965); M. Onoe, H. Jumonji and N. Kobori, "High Frequency Crystal Filters Employing Multiple Mode Resonators Vibrating in Trapped Energy Modes," Proc. 20th Annual Symposium on Frequency Control, 266 (1966); R. A. Sykes and W. D. Beaver, "High Frequency Monolithic Crystal Filters with Possible Application to Single Frequency and Single Side Band Use," Proc. 20th Annual Symposium on Frequency Control, 288 (1966); and H. F. Tiersten, *Linear Piezoelectric Plate*

*Vibrations,* Plenum Press, New York (1969), Chapter 16. This energy trapping effect is well known and has been employed in the design of monolithic crystal filters and trapped energy resonators.

By utilizing the acoustic energy trapping effect, the present invention produces a transducer array or mosaic in which a plurality of sets of electrodes are placed on a uniform piezoelectric plate a suffcient distance apart for them to act essentially independently. Energy trapping, and therefore isolation, is achieved by operating in a frequency range in between the frequencies of thickness vibration of the electroded and unelectroded regions. This causes the dominant component of the mode in the unelectroded region to decay with distance from the electrode.

The monolithic mosaic transducer of the present invention has the capability of very small size. In addition, it has the advantages of less positioning error for the transducer elements and smaller fabrication cost since well-known processes of photolithography used in integrated circuits can be employed to lay down the electrodes on the piezoelectric material.

It is therefore an object of the present invention to provide a transducer array.

A further object is to provide an array of transducers of piezoelectric elements in which the elements are isolated by the trapping of acoustic energy.

An additional object is to provide a transducer array formed on a piece of piezoelectric material, which can be of uniform thickness, with the electrodes of the transducer either plated thereon or placed in close proximity thereto.

Other objects and advantages of the invention will become more apparent upon reference to the following specification and annexed drawings in which:

FIG. 4 is a diagram showing the measured amplitude of the wave excited by the transducer when operating in a frequency range in which energy trapping is present; and FIGS. 5A and 5B respectively show an elevational view, partly in section, and a top plan view of a two dimensional transducer array.

FIG. 6 is an elevational view of a transducer array with electrodes separated from the transducer plate.

Figure 1:
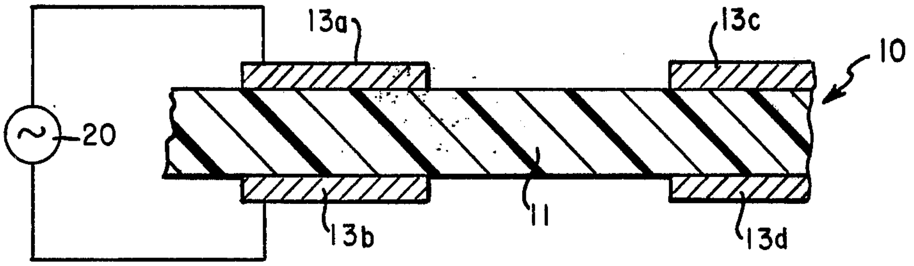
FIG. 1 is an elevational view, partly in section, demonstrating the operating principles of the subject invention.

FIG. 1 shows a portion of a transducer 10 which includes a plate 11 of piezoelectric material. Various material and synthetic piezoelectric materials can be used, suitable materials, for example, being certain of the polarized ferroelectric ceramics. Metal electrodes, for example, of silver, gold or other suitable conductive materials are placed on opposite sides of the plate 11. The electrodes are placed in pairs, that is, one opposite the other. One pair **13*a*–13*b* and a portion of a second pair 13*c*–13*d* are shown. The complete mosaic transducer of the subject invention would have a number of pairs of electrodes. The electrodes can have any suitable shape, for example, round, rectangular, square, strip, etc. As explained in several of the aforementioned publications, the electrodes can be plated directly onto plate 11. The degree of mass loading, or so-called plate-back, influences the energy trapping effect and can profitably be used in fabrication to assure that each isolated element performs as desired, for example, has maximum response at the same driving frequency. However when large coupling materials are used such as the polarized ferroelectric ceramics, the electrical shorting of the electrodes primarily determines the energy trapping effect as discussed later. FIG. 1 shows a plate with open spaces between the electrodes on both sides of the plate. The piezoelectric plate can have one surface fully plated. The electrodes of either or both sides, need not actually be in physical contact with the plate. They can be spaced from the plate and the electric field coupled from the electrodes to the plate. The spacing should not be so great that the shorting effect is significantly lost. Instead of using separated electrodes one side of the plate 11** can be covered with a known semiconductor material on which the electrodes are located. The semiconductor material can be made conductive in selective areas by suitable techniques, for example, irradiation with a laser beam or other light of a suitable frequency consistent with the semiconductor material with the electrodes made sufficiently thin so that the light can pass through to the semiconductor, doping of the semiconductor, etc. This effectively electrically connects the electrodes to the plate.

The pairs of electrodes are excited by energy of a suitable frequency by any suitable means represented in FIG. 1 by the source 20 and various modes are generated in the piezoelectric body 11. In the trapped energy resonators and monolithic crystal filters of the prior art it is the shear modes which are usually employed. In the mosaic transducer of the subject invention, it is the thickness extensional modes which are of primary interest.

Energy trapping occurs in the unplated region between adjacent electrodes on the same side of the plate. In the present invention, the trapping is used to provide isolation between the adjacent electrodes and to thereby produce a transducer with a plurality of elements, each of these elements formed by a pair of electrodes and the interposed piezoelectric plate. The trapping effect is explained below.

Figure 2:
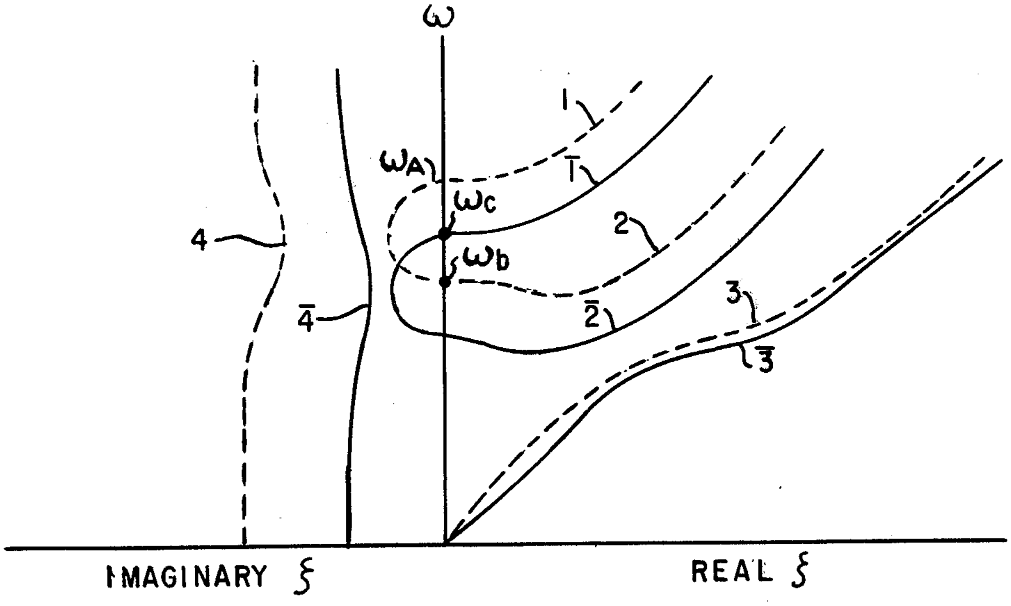
FIG. 2 depicts dispersion curves for fully electroded and unelectroded plates.

Typical dispersion curves giving the frequency $\omega$ as a function of the propagation wavenumber $\epsilon$ for the extensional (symmetric) modes are shown in FIG. 2. The dotted line curves are for an unelectroded plate and the solid line curves for a fully electroded plate which is electrically shorted. The curves shown are of some significance at frequencies in the vicinity of the fundamental thickness-extensional frequencies of the unelectroded and fully electroded plate. When the dispersion curves are on the left of the vertical axis, the wavenumber $\epsilon$ is purely imaginary and the associated displacement field decays with distance. An approximate solution to this problem can be obtained by substituting the solution functions associated with the dispersion curves in FIG. 2 in what remains to be satisfied in the unconstrained variational principle of linear piezoelectricity. This is discussed in Tiersten, Linear Piezoelectric Plate Vibrations eq. (6.44) supra.

Energy trapping is achieved, according to the invention, when the resonance frequency $\omega_A$ of any odd thickness extensional mode is greater than the resonance frequency $\omega_B$ of the pertinent even thickness shear mode and $\overline{\omega}_C$, defined in equation (1) below, lies between $\omega_A$ and $\omega_B$. Under these conditions energy tapping is attributed primarily to the electrode shorting effect and, to a lesser extent, to the mass loading of the electrodes. As a result of the foregoing, the piezoelectric plate 11 can be of uniform thickness throughout its length. The plate 11 can optionally have grooves formed in it to control the values of the resonant frequencies in order to satisfy the frequency constraints for energy trapping in accordance with the invention and for increasing the band width. Since such grooves are for the purpose of determining the resonant frequencies of the transducer elements and not merely for providing mechanical isolation between the transducer elements without consideration of their resonant frequencies as is done in the prior art, the locations and dimensions of the grooves must be determined consistent with the frequency characteristics of the plate and electrodes, e.g., so that all transducer elements will have the same resonant frequencies and $\omega_A > \overline{\omega}_C > \omega_B$. Compensation for plate thickness variations which would otherwise result in differences in the resonant frequencies of the transducer elements can be achieved by varying the electrode dimensions to achieve like resonant frequencies among the transducer elements.

The general conditions under which energy trapping can be realized practically in a transducer structure operating primarily in the fundamental thickness extensional mode can be obtained from the following considerations. The critical thickness frequencies $\omega_A$, $\omega_B$ and $\overline{\omega}_C$ for the fundamental extensional mode are given by $$\omega_A = \frac{\pi}{2h}\left(\frac{\bar{c}_{33}}{\rho}\right)^{\frac{1}{2}},\ \omega_B = \frac{\pi}{h}\left(\frac{c_{55}}{\rho}\right)^{\frac{1}{2}},\ \overline{\omega}_C = \eta_1\left(\frac{\bar{c}_{33}}{\rho}\right)^{\frac{1}{2}} \quad (1)$$

where $\eta_1$ is the lowest root of $$\tan \eta_1 h = \eta_1 h/(k_{33}^2 + R\eta_1^2 h^2), \quad (2)$$

and $$\bar{c}_{33} = c_{33} + \frac{e_{33}^2}{\epsilon_{33}},\ k_{33}^2 = \frac{e_{33}^2}{\bar{c}_{33}\epsilon_{33}},\ R = \frac{2\rho' h'}{\rho h}, \quad (3)$$

in which, $c_{pq}$, $e_{33}$, $\epsilon_{33}$, $\rho$ and $\rho'$ denote the elastic constants, a piezoelectric constant, a dielectric constant, the mass density of the plate and the mass density of the electrode, respectively. For low modes of large coupling materials the mass loading term $R\eta_1^2h^2$ is much less than the piezoelectric coupling term in (2) and we may write $$\tan \eta_1 h = \eta_1 h/k_{33}^2. \quad (4)$$

Equation (4) shows that the piezoelectric coupling reduces the thickness frequency for an electroded section from that of an unelectroded section, the greater the reduction the lower the mode number. For a discussion of this see H. F. Tiersten, "Thickness vibrations of Piezoelectric Plates," J. Acoust. Soc. Am., 35, 53 (1963). For large coupling materials the reduction is quite large. See M. Onoe, H. F. Tiersten and A. H. Meitzler, "Shift in the Location of Resonant Frequencies Caused by Large Electromechanical Coupling in Thickness-Mode Resonators, " J. Acoust. Soc. Am., 35, 36 (1963).

From the foregoing, it can be seen that $\overline{\omega}_C < \omega_A$. As noted earlier, if $\omega_A > \omega > \overline{\omega}_C$, the solution function in the unelectroded region corresponding to the dispersion curve labeled 1 in FIG. 2 will be a decaying exponential, while the solution function in the electroded region corresponding to $\overline{1}$ will have trigonometric dependence. Since the curves labeled 1 and $\overline{1}$ are strongly coupled and constitute the dominant portion of the mode in the aforementioned frequency range, this type of mode is referred to as a trapped energy mode. However, it should be remembered that since the mode contains solution functions in the unelectroded region associated with curves 2 and 3, which are propagating it is not completely trapped. Nevertheless, since the amplitudes of the propagating waves in the modes are relatively small compared to the amplitude of the trapped wave, the mode may be said to be essentially trapped.

Since it is necessary that the transducer operate in an extensional mode and the pertinent dispersion curves are almost always of the general shape shown, it is essential that $\omega_A > \omega_B$. From (1) it is clear that the condition for this is that $$\overline{c}_{33} > 4c_{55}. \tag{5}$$

In fact, since it is desirable to have the bandwidth as large as possible, it is advantageous to have $\overline{c}_{33}$ as much larger than $4c_{55}$ as possible.

Since for $\omega > \omega_A$ the solution function associated with curve 1 in the unelectroded region is not a decaying exponential, there is no trapped energy mode for $\omega > \omega_A$. Moreover, there is essentially no trapped energy mode for $\omega > \overline{\omega}_C$ because for $\omega > \overline{\omega}_C$ the solution function associated with curve 1 in the electroded region is not trigonometric. As a consequence, the bandwidth of the transducer structure is $\omega_A - \overline{\omega}_C$ provided $\overline{\omega}_C > \omega_B$. Since $\omega_A - \overline{\omega}_C$ increases with $k_{33}$, the larger the piezoelectric coupling, the greater the bandwidth.

It should be noted that the untrapped length-extensional waves in the mode of the trapped energy transducer do not cause much of a limitation on the performance of the device because the motion induced by these waves on the major surface of the transducer is primarily tangential to the fluid and, hence, does not couple strongly.

A material possessing constants satisfying all the aforementioned requirements quite well is the polarized ferroelectric ceramic PZT-7A, a polarized form of lead zirconate titanate. This material has a calculated bandwidth of 12.8%.

Although the above detailed analytical discussion is for the fundamental thickness extensional mode, the invention is applicable in the use of any odd overtone of thickness extension which can be trapped in an unelectroded region.

Figure 3A:
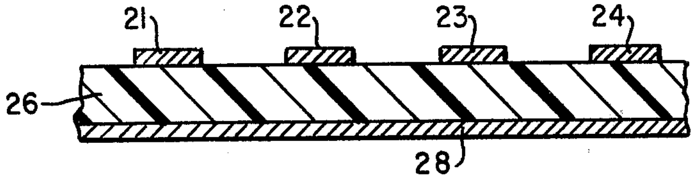
FIG. 3A is an elevational view, in schematic form of a linear array mosaic transducer according to the invention.
Figure 3B:
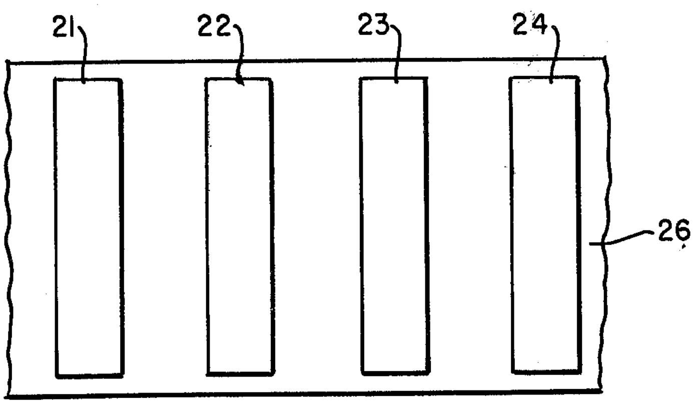
FIG. 3B is a top plan view of the mosaic transducer of FIG. 3A.

FIGS. 3A and 3B show a linear transducer array having strip electrodes 21, 22, 23, 24 plated on one surface of a plate 26, of material having piezoelectric properties similar to those of PZT-7A, which is poled in the thickness direction. The other surface of the plate is fully electroded. In an experiment, the transducer of FIGS. 3A and 3B, the plate 26 being 0.5 mm thick, was immersed in a water bath and excited by a suitable source. It was probed by detecting the light from a He-Ne laser that was diffracted by the acoustic wave in the water.

Typical results from this experiment are shown in FIG. 4. The vertical direction of the graph indicates the amplitude of diffracted light that was detected at a distance of one millimeter from a transducer with three strips excited. The amplitude peaks generally correspond to the locations of the strip electrodes with the valleys in between showing the isolation. It is clear from FIG. 4 that the isolation of each electrode is quite good and that the aforementioned unwanted untrapped length-extensional waves do not have an appreciable influence on the operation of the device. The measured bandwidth of the behavior indicated in FIG. 4 was around 14% which is in reasonable agreement with the calculated value of 12.8%.

FIGS. 5A and 5B show a typical form of transducer in accordance with the present invention. Here a plate 30 of piezoelectric material, for example PZT-7A polarized in the thickness direction, is provided. Other suitable piezoelectric materials can be used. A conductive metal film 34 is fully plated over one surface of the plate and an array of circular electrodes 36 on the other surface. The electrodes 36 are shown as circular and arrayed in a square matrix of rows and columns of equal number. As indicated previously, the electrodes 36 can have any suitable shape. Also, the array can be other than square, for example, rectangular, triangular, or odd shaped. In general the spacing between the adjacent electrodes 36 is made regular but this also can be varied to suit a particular need. That is, an array can be formed with electrodes unevenly spaced to achieve a desired energy distribution for the transducer.

Plate 30 can be mounted on a body 40 of flexible material, for example rubber but mounting on such a body is not required. Electrical connection to the transducer can be through an insulating material 50, semiconductor or otherwise, which is deposited over the electrodes 36 on piezoelectric plate 30.

In the operation of the transducer of FIG. 5 as a sensor, mechanical energy is applied to the body 40 or metal film 34 in the absence of the body 40 and this is transduced by the electrodes 34 and 36 into electrical energy. The transducing operation is as previously described using the trapped energy modes wherein the thickness extension mode is excited and utilized in the plate. Each separate electrode 36 together with the continuous film electrode 34 and the interposed piezoelectric body 30, forms an element of the transducer. There is energy trapping in the unplated region of the body 30, that is, in the areas between the electrodes 36, so that the transducer elements are substantially isolated from each other.

Each of the elements of the array of transducer elements converts the mechanical energy into electrical energy. The amplitude of the electrical energy depends upon the amplitude and location of the mechanical energy applied to the transducer, e.g. to body 40 or metal film 34.

The electrical energy is coupled out from the electrodes 36. Since each of the transducer element electrodes 36 has a discrete quantity of electrical energy, the various quantities can be taken out in any suitable manner. For example, switching circuits, not shown, can take out the energy from all elements at the same time, row by row, line by line, etc. In effect, a transducer array structure is produced which can be scanned.

The reverse operation for the transducer as an exciter also holds. That is, the electrodes 36 on piezoelectric plate 30 can be excited electrically. The resultant mechanical energy can then be coupled to body 40. In either case, it may be preferable to use electrodes matching the configuration of electrodes 36 rather than the continuous electrode 34.

Furthermore, although the reverse operation has been described for transducers wherein electrodes 36 are mounted on the piezoelectric plate 30, such mounting is not essential and the electrodes in this case may be separately supported, by means not shown, in closely spaced relationship to the plate 30 as shown in FIG. 6.

As explained previously, the amount of acoustic energy trapping can be controlled to some degree by the mass loading of the electrodes on the piezoelectric plate. However, this is not a principal factor.

In addition to being useful in biological applications, the present invention can also be used in non-destructive testing in which shear modes as well as extensional modes can be utilized. Furthermore, the invention can be used in any receiver or transmitter, e.g., Sokolov tube, laser interferometer, Fresnel plate, or other device that uses separate electrodes and piezoelectric material for energy trapping.

What is claimed is:

1. A transducer element array comprising:

a plate of piezoelectric material, means for vibrating said plate to produce vibration thereof including vibration in the thickness extensional mode, a plurality of first electrode means operatively electrically coupled to one surface of said plate in spaced relationship with respect to each other and second electrode means operatively electrically coupled to said other surface of said plate to form with said plurality of first electrode means a plurality of pairs of electrodes, each said pair of electrodes forming a transducer element of the array, said plurality of pairs of electrodes being operatively electrically coupled to said piezoelectric plate so as to provide acoustic energy trapping of the thickness extensional mode of vibration in the unelectroded space between adjacent ones of said pairs of electrodes and to thereby provide acoustic isolation between the adjacent transducer elements.

2. A transducer array as in claim 1 wherein the frequency $\omega$ of the trapped acoustic energy lies between the resonance frequency $\omega_A$ of an odd thickness extensional mode of vibration of the unelectroded region of the plate and the resonance frequency $\overline{\omega}_C$ of the corresponding odd thickness extensional mode of vibration of the electroded region of the plate.

3. A transducer array as in claim 2 wherein the frequency $\omega_A$ is higher than the frequency $\omega_B$ of the pertinent even thickness extensional mode of vibration of the unelectroded space of the plate.

4. A transducer array wherein said plate of piezoelectric material is of substantially uniform thickness throughout.

5. A transducer array as in claim 1 wherein said second electrode means comprises a continuous member.

6. A transducer array as in claim 1 wherein said second electrode means comprises a plurality of means each of the same general shape as the respective means of the first plurality of electrode means, each of said second electrode means located opposite a corresponding one of said first electrode means.

7. A transducer array as in claim 1 wherein each of said first electrode means is of generally circular shape.

8. A transducer array as in claim 1 wherein said means for exciting said piezoelectric plate excites the same to produce a thickness extension mode.

9. A transducer array as in claim 1 wherein said means for exciting said plate comprises means for coupling mechanical energy to said second electrode means.

10. A transducer array as in claim 9 further comprising means for coupling electrical energy from said second electrode means.

11. A transducer array as in claim 1 wherein said means for exciting said plate comprises, means for supplying electrical energy to pairs of electrodes.

12. A transducer as in claim 11 further comprising means for coupling mechanical energy therefrom.

13. A transducer array as in claim 1 wherein $\omega_A > \overline{\omega}_C > \omega_B$.

14. A transducer array as in claim 1 wherein said piezoelectric material is a polarized ceramic.

15. A transducer array as in claim 14 wherein said polarized ceramic is PZT-7A.

* * * * *